United States Patent
Liu et al.

[11] Patent Number: 5,972,773
[45] Date of Patent: *Oct. 26, 1999

[54] HIGH QUALITY ISOLATION FOR HIGH DENSITY AND HIGH PERFORMANCE INTEGRATED CIRCUITS

[75] Inventors: Yowjuang W. Liu, San Jose; Ming-Ren Lin, Cupertino, both of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/869,466

[22] Filed: Jun. 5, 1997

Related U.S. Application Data

[63] Continuation of application No. 08/409,814, Mar. 23, 1995, abandoned.

[51] Int. Cl.$^6$ .................................................. H01L 21/762
[52] U.S. Cl. ........................... 438/424; 438/445; 438/438; 438/696
[58] Field of Search ..................................... 438/445, 443, 438/693, 692, 696, 424, 439, FOR 227, FOR 229

[56] References Cited

U.S. PATENT DOCUMENTS

| | | |
|---|---|---|
| 4,495,025 | 1/1985 | Haskell . |
| 4,671,851 | 6/1987 | Beyer et al. . |
| 4,707,218 | 11/1987 | Giammarco et al. . |
| 4,792,534 | 12/1988 | Buji et al. . |
| 5,137,843 | 8/1992 | Kim et al. . |
| 5,298,451 | 3/1994 | Rao . |
| 5,374,585 | 12/1994 | Smith et al. . |
| 5,397,733 | 3/1995 | Jang . |
| 5,399,520 | 3/1995 | Jang . |

FOREIGN PATENT DOCUMENTS

| | | |
|---|---|---|
| 62229960 | 10/1987 | Japan . |
| 63300526 | 12/1988 | Japan . |
| 6224187 | 8/1994 | Japan . |

*Primary Examiner*—George Fourson
*Attorney, Agent, or Firm*—Townsend and Townsend and Crew LLP

[57] ABSTRACT

A novel semiconductor fabrication process having the advantages of conventional LOCOS (process simplicity and reduced defects) while providing a scaleable, planar isolation region between active regions formed in a semiconductor substrate. The preferred process includes formation of a barrier layer and a masking layer over the substrate. An active region mask defines an exposure region of the masking layer. The exposure region is etched to form an opening, exposing a portion of barrier layer in the opening. A spacer is added inside the opening, around a perimeter of the opening to define a second exposure region. The barrier layer, and substrate, under the second exposure region, but not under the spacer, are etched to form an isolation region opening. The isolation region opening may have a suitable isolating material, such as silicon oxide, grown, filled, or some combination of both, in the isolation region opening. The spacer width and the depth of the isolation region opening are independently controllable.

27 Claims, 3 Drawing Sheets

FIG_1
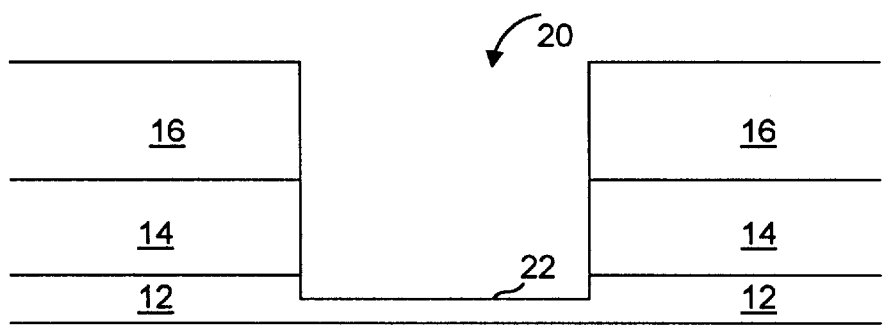
FIG_2
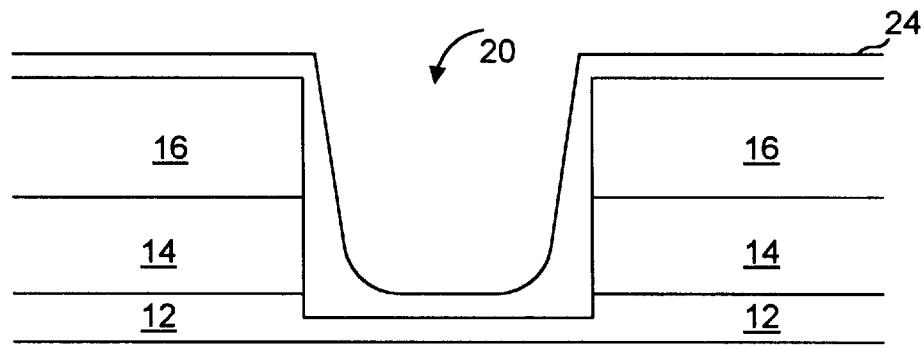
FIG_3

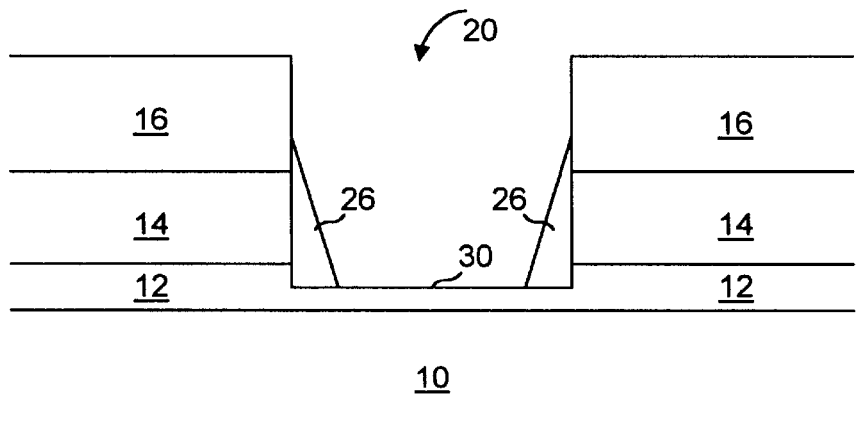
FIG_4
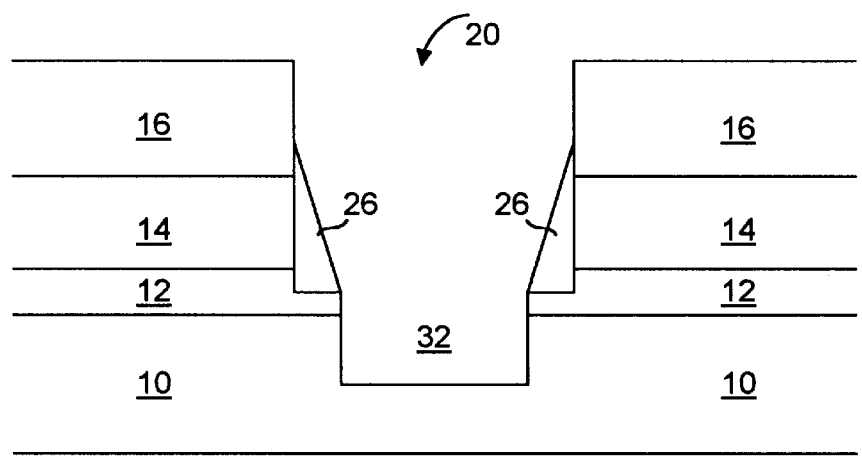
FIG_5
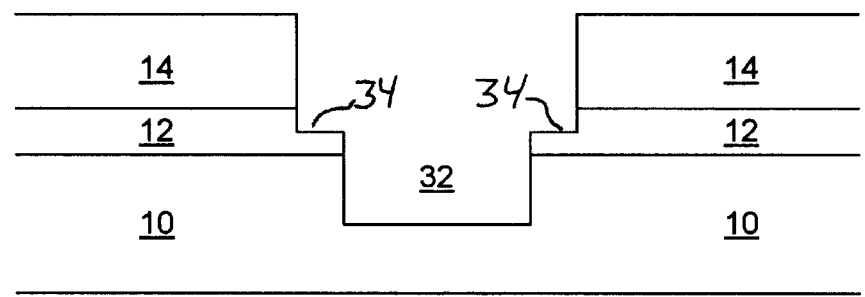
FIG_6

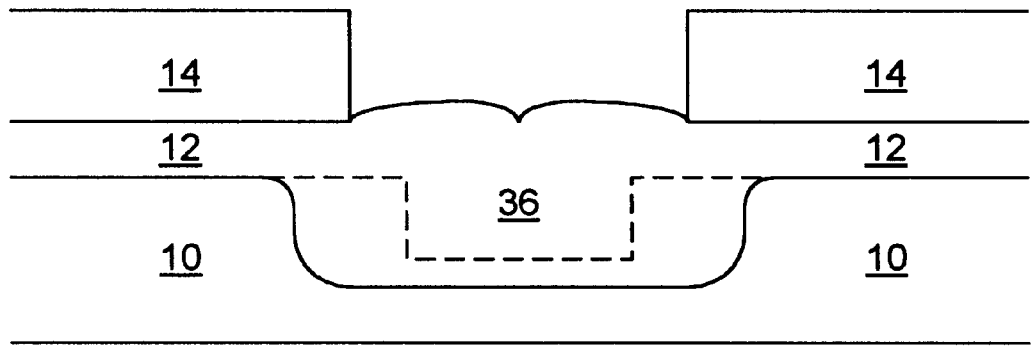
FIG_7
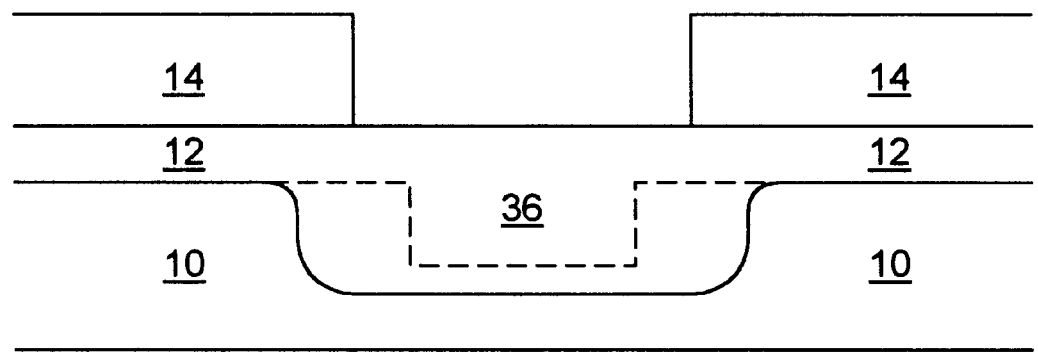
FIG_8

5,972,773

HIGH QUALITY ISOLATION FOR HIGH DENSITY AND HIGH PERFORMANCE INTEGRATED CIRCUITS

This is a Continuation of application Ser. No. 08/409,814, filed Mar. 23, 1995, now abandoned, the disclosure of which is incorporated by reference.

CROSS-REFERENCE TO RELATED APPLICATIONS

This application is related to "METHOD FOR LOCAL OXIDATION OF SILICON EMPLOYING TWO OXIDATION STEPS," U.S. Pat. No. 5,151,381, hereby expressly incorporated by reference for all purposes.

BACKGROUND OF THE INVENTION

The present invention relates generally to an improved local oxidation of silicon (LOCOS) process. More specifically, improved LOCOS and silicon etch processes are disclosed that provide an effective isolation permitting device scaling beyond the present state of the art.

Isolation is a fundamental semiconductor device fabrication process designed to electrically isolate active regions in a semiconductor substrate. The incorporated US patent referenced above identifies a number of conventional isolation methods, and describes some of the drawbacks to implementation of these various processes. Conventional LOCOS, or modified LOCOS, remains the preferred process for high-volume manufacturing when implementing standard sub-micron integrated circuit technology.

Research on improved processes has heretofore resulted in increasingly complex processing requirement, while continuing to produce various device degradations due to various defects. It is important to design a simple, cost effective alternative to LOCOS processing to overcome some or all of its disadvantages. The well-known disadvantages of conventional LOCOS processing are that the resulting isolation oxide is not planar, nor is it deep enough in the substrate to provide effective isolation to improve device scaling without compromising device performance.

Scaling refers to an ability to improve transistor density in a semiconductor by decreasing an amount of substrate area required to implement various semiconductor structures in the substrate. The LOCOS process does not scale well in that variations in processing to reduce the substrate area required to form the isolation regions negatively impacts on the performance of devices formed in the active regions.

From the foregoing, it is apparent that an improved process for forming isolation regions in a semiconductor substrate is desirable. This improved process should offer the advantages of conventional LOCOS (i.e., it is simple to implement and has few stresses/defects that adversely affect device performance) and improves on some of its disadvantages (e.g., planarity, scalability, bird's beak formation, and isolation effectiveness).

SUMMARY OF THE INVENTION

The present invention provides an improved method for simply, efficiently and economically providing a process that produces fully planar and scaleable isolation regions. These isolation regions offer improved isolation effectiveness and permit a high quality gate oxide without negatively affecting device performance.

According to one aspect of the invention, it includes a method of forming a spacer around an isolation region opening to space a masking layer away from the opening prior to growing/filling the isolation region opening with an isolation oxide. The isolation oxide is controllable in horizontal and vertical dimensions, allowing devices to be packed close together and still maintain effective, high quality isolation by controlling the vertical depth of the isolation oxide.

In the preferred method, a semiconductor substrate is processed to form the high quality, high performance, scaleable isolation oxide. A masking layer overlies a barrier layer that in turn overlies the substrate. An active region ask overlies the masking layer, with an exposure region identifying a portion of the masking layer to be etched. The masking layer is etched to expose a second portion of the barrier layer through an opening in the masking layer. A spacer is applied within the opening that covers a perimeter portion of the exposed barrier layer, thereby exposing a second portion of the barrier layer. The exposed second portion of the barrier layer and the substrate underlying the exposed second portion of the barrier layer are etched to form an isolation oxide opening. Thereafter, the spacer and active region mask are removed. Both the spacer width and depth of the isolation oxide opening are controllable.

Reference to the remaining portions of the specification, including the drawing and claims, will realize other features and advantages of the present invention. Further features and advantages of the present invention, as well as the structure and operation of various embodiments of the present invention, are described in detail below with respect to accompanying drawing. In the drawing, like reference numbers indicate identical or functionally similar elements.

BRIEF DESCRIPTION OF THE DRAWINGS

FIG. 1 is a partial, sectional view of a portion of a semiconductor substrate having an overlying barrier layer and an overlying masking layer;

FIG. 2 is a partial, sectional view of a portion of a semiconductor substrate shown in FIG. 1 after an active region mask had been applied to the device and a nitride etch process completed;

FIG. 3 is a partial, sectional view of a portion of a semiconductor substrate shown in FIG. 2 after a second layer thin resist coating had been applied to the device;

FIG. 4 is a partial, sectional view of a portion of a semiconductor substrate shown in FIG. 3 after an RIE $O_2$ etch process has been applied to the device;

FIG. 5 is a partial, sectional view of a portion of a semiconductor substrate shown in FIG. 4 after an oxide and silicon etch process has been applied to the device;

FIG. 6 is a partial, sectional view of a portion of a semiconductor substrate shown in FIG. 5 after a resist strip process has been applied to the device;

FIG. 7 is a partial, sectional view of a portion of a semiconductor substrate shown in FIG. 6 after a high temperature dry LOCOS oxidation process has been applied to the device; and FIG. 8 is a partial sectional view of a portion of a semiconductor substrate shown in FIG. 7 after a chemical, mechanical polish (CMP) processing has been applied to the device.

DESCRIPTION OF THE PREFERRED EMBODIMENT

FIG. 1 is a partial, sectional view of a portion of a semiconductor substrate 10 having an overlying barrier layer 12 and an overlying masking layer 14. Barrier layer 12 is formed at a surface of substrate 10. Barrier layer 12 is optionally an oxide layer formed by thermal oxidation of substrate 10. Alternatively, barrier layer 12 may be formed by depositing an oxide layer, or other material, that provides a barrier between substrate 10 and a layer that overlies barrier layer 12, such as masking layer 14. Barrier layer 12 preferably is a material that is removable from substrate 10 without damaging it.

Masking layer 14 is a non-oxidizing layer provided over barrier layer 12. In a preferred embodiment, masking layer 14 is a deposited nitride layer. Conventional chemical vapor deposition (CVD) processes may be used to form the deposited nitride layer. It is desirable to provide masking layer 14 to protect covered portions of substrate 10 from being oxidized during subsequent processing. Barrier layer 12 has a thickness $T_{bl}$ and masking layer 14 has a thickness $T_{ml}$. In the preferred embodiment, $T_{bl}$ ranges from about ten to about three hundred Å, and $T_{ml}$ ranges from about five hundred to about two thousand five hundred Å.

FIG. 2 is a partial, sectional view of a portion of substrate 10 shown in FIG. 1 after an active region mask 16 had been applied and a nitride etch process completed. A layer of photoresist is applied overlying masking layer 14, and subsequently exposed to produce a desired pattern. This desired pattern establishes active regions, e.g., source/drain regions in a field effect transistor (FET). Selected areas of masking layer 14 are exposed after removing the unwanted portions of the photoresist layer. The remaining photoresist forms active region mask 16 that protects those regions of substrate 10 from subsequent process steps that form a desired isolation region.

After selectively exposing portions of masking layer 14, a masking layer etch process removes those portions of masking layer 14 exposed by active region mask 16. In the preferred embodiment wherein masking layer 14 is silicon nitride, a conventional nitride etch process removes the exposed portion of silicon nitride to expose a portion 22 of barrier layer 12 in an opening 20. For purposes of the following discussion, opening 20 (and hence exposed portion 22) has a width $T_W$ that is about 0.25 micrometers wide.

FIG. 3 is a partial, sectional view of a portion of substrate 10 shown in FIG. 2 after a second layer thin resist coating 24 has been applied to the device. In the preferred embodiment, second layer thin resist coating 24 has a thickness $T_R$ that is in a range of about one hundred Å to about one thousand five hundred Å. Second layer resist coating 24 overlies active region mask 16 and flows into opening 20 to cover exposed portion 22.

FIG. 4 is a partial, sectional view of a portion of substrate 10 shown in FIG. 3 after a second layer resist etch process has been applied to the device. The process results illustrated in FIG. 3 and FIG. 4 are a preferred embodiment for creation of a spacer 26 in opening 20. Spacer 26 has a perimeter thickness $T_{peri}$ that covers a perimeter portion of exposed portion 22 of barrier layer 12. In the preferred embodiment, $T_{peri}$ is about 0.05 micrometers. When spacer 26 is formed of resist material, such as in the preferred embodiment, spacer 26 is formed in opening 20 after second layer thin resist coating 24 is etched. A conventional reactive ion etch (RIE) (timed etch or end-point etch) forms spacer 26 from the second layer thin resist 24.

Formation of spacer 26 inside opening 20 exposes a second portion 30 of barrier layer 12 that has less surface area than exposed portion 22. Second exposed portion 30 has a width $T_{W2}$. $T_{W2}$ has a range of $T_W-2*T_{peri}$, or about 0.15 micrometers in the present example.

FIG. 5 is a partial, sectional view of a portion of substrate 10 shown in FIG. 4 after an oxide and a silicon etch process have been applied to the device. Application of the oxide and silicon etch processes form an isolation region opening 32 underlying second exposed portion 30. Active region mask 16 and spacer 26 protect other areas of substrate 10, barrier layer 12 and masking layer 14 from the oxide and silicon etch processes. Isolation region opening 32 has width about equal to $T_{W2}$ and an adjustable depth. The depth is adjustable, depending upon a duration of the silicon etch process. In the preferred embodiment, isolation region opening 32 has a depth in a range of about 0.05 micrometers to about 1.0 micrometers with a preferred depth of 0.15 micrometers FIG. 6 is a partial, sectional view of a portion of substrate 10 shown in FIG. 5 after a resist strip process has been applied to the device. The resist strip process removes active region mask 16 and spacer 26. Removing active region mask 16 exposes remaining portions of masking layer 14. Removing spacer 26 exposes a perimeter ledge 34 surrounding isolation region opening 32. Ledge 34 spaces masking layer 14, and a portion of barrier layer 12, away from isolation region opening 32.

FIG. 7 is a partial, sectional view of a portion of substrate 10 shown in FIG. 6 after an oxidation process has been applied to the device. As shown, the oxidation process creates a field oxide ($F_{OX}$) 36 within isolation region opening 32 (shown in FIG. 6) having a thickness $T_{OX}$. The oxide in the preferred embodiment is grown so that $T_{OX}$ is in the range of about 1500 Å to about 8000 Å, more preferably, $F_{OX}$ 36 has $T_{OX}$ about equal to 2500 Å. One method of creating $F_{OX}$ 36 is to implement the high temperature dry LOCOS oxidation process described in the incorporated U.S. Pat. No. 5,151,381. Other oxidation processes may produce suitable isolation regions, depending upon the particular implementation and application.

$F_{OX}$ 36 offers the benefits of a conventional LOCOS isolation region in that it is relatively simple to create, and has low levels of stresses and defects. Additionally, $F_{OX}$ 36 has a number of advantages over isolation regions created using LOCOS, or modified LOCOS processes. These advantages include a fully planar isolation oxide, improved isolation effectiveness, formation of a high-quality gate oxide, devices implemented in active regions protected by $F_{OX}$ 36 can have improved performance, and scalability of designs is improved.

Regarding the fully planar isolation regions. $T_{OX}$ is adjustable to match with spacings of masking layer 14. That is, opening 20 shown in FIG. 4, for example, is filled when oxide layers grown from opposing sidewalls of isolation region opening 32 (shown in FIG. 6) meet. In other words, in the preferred embodiment, surface planarity results from growing $F_{OX}$ 36 from the silicon sidewalls of isolation region opening 32.

FIG. 8 is a partial sectional view of a portion of a semiconductor substrate shown in FIG. 7 after a chemical, mechanical polish (CMP) processing has been applied to the device. The CMP process produces a fully planar isolation region.

One measure of how effective an isolation region is to determine an effective isolation length between two adjacent active regions. $F_{OX}$ 36 has an effective length that depends upon $T_{OX}$. $T_{OX}$ is variable and may be made relatively large, allowing an effective isolation length of $F_{OX}$ 36 to be increased over conventional LOCOS field oxidation virtually at will.

Gate oxide in the active region near the isolation (that could be a thermally grown field oxide, such as $F_{OX}$ 36) is improved because silicon damage near the bird's beak is minimal. The minimal silicon damage results from keeping silicon etching away from edges of masking layer 14 shown in FIG. 5, for example.

One advantage to the high quality gate oxide is that higher performing circuits can be formed in the active regions. Trench or recessed LOCOS processing requires a relatively heavy doping of the field oxide regions in order to suppress leakage induced by silicon damage. In the preferred embodiment, after formation of isolation, a field implant may be applied to improve effective isolation field thresholds. The field implant may be a lighter concentration than required using the trench or recessed LOCOS process. The lighter concentration maintains low background concentration and low background capacitance in active areas. Again, the lighter field implant on the bird's beak is feasible because the silicon etch is kept away from the bird's beak.

Scaleability is improved because of added flexibility in establishing a desired silicon depth for isolation. As discussed above, scalability refers to moving active regions closer together, as their feature sizes are decreased. To move active regions closer together requires that $T_W$ of opening 20 shown in FIG. 2, for example, be decreased. Unfortunately, using conventional LOCOS, moving nitride layers closer together reduces the effectiveness of field oxide regions, possibly resulting in less than optimum isolations. Isolation is controllable in two dimensions, horizontal spacing and vertical depth. Controlling these variables independently permits closer packing of active regions, because isolation can be optimized by controlling the depth of isolation.

FIGS. 1–8 above describe a preferred embodiment for forming an effective field oxide for improved isolation, as well as a novel semiconductor structure having a barrier layer disposed away from an isolation region opening. As discussed in more detail above, spacer 26 shown in FIG. 4, for example, is formed by a second thin layer of resist applied into opening 20. There are other ways of forming this spacer.

For example in FIG. 3, a thin, low temperature oxide layer may be applied over masking layer 14 after active region mask 16 is removed and over the exposed portion 22 in place of second layer thin resist coating 24. For example, a silicon dioxide layer may be deposited by decomposing tetraethoxysilane (TEOS) in a low pressure chemical vapor deposition reactor in well-known fashion. Thickness of the low temperature oxide is preferably in the same range as the second layer thin resist coating, about one hundred Å to about one thousand Å. In still other embodiments, a layer of another material such as spin-on-glass (SOG) may be used in place of second layer resist 24. The SOG layer may have a thickness of about 100 Å to about 3000 Å.

Thereafter, an RIE oxide etch forms spacer 26 from the low temperature oxide layer. Thereafter, the isolation region opening is etched using the oxide spacer in opening 20. A diluted hydrofluoric acid solution removes the oxide spacer in preparation for formation of the isolation. In an alternate preferred embodiment, some other wet etch process, such as a plasma etch, or a dry etch process may be used for spacer removal.

As discussed above, the isolation is preferably grown in isolation region opening 32 shown in FIG. 6 using the process described in the incorporated patent. In an alternate preferred embodiment, the isolation may be formed by filling isolation region opening 32 with low temperature oxide or spin-on-glass, or partially grown and partially filled. Different applications may require different implementations.

In conclusion, the present invention provides a simple, efficient solution to a problem of constructing a high quality isolation for high density/high performance integrated circuits. The present invention allows simple processing steps to achieve high quality, truly planar and scaleable field oxides. While the above is a complete description of the preferred embodiments of the invention, various alternatives, modifications, and equivalents may be used. For example, the preferred embodiment describes isolation as a thermally grown field oxide. Other types of isolation may be used such as a filled oxide, filled polysilicon, or filled nitride, for example. Therefore, the above description should not be taken as limiting the scope of the invention which is defined by the appended claims.

What is claimed is:

1. A processing method to provide an isolation region in a semiconductor substrate, comprising the steps of:

providing a barrier layer directly overlying the substrate without any intervening layers between said barrier layer and the substrate;

depositing a masking layer overlying said barrier layer;

applying an active region mask overlying said masking layer, said active region mask having an exposure region exposing a portion of said masking layer;

exposing and etching a portion of said barrier layer underlying said exposure region by etching through said portion of said masking layer and into said portion of said barrier layer, to provide an opening through said active region mask and said masking layer;

applying a removable spacer inside said opening to cover a perimeter portion of said portion of said barrier layer to thereby expose an etch region of said portion of said barrier layer;

etching said barrier layer and said substrate that underlie said etch region but not under said spacer to provide for an isolation region opening in said substrate; and removing, prior to any subsequent high temperature thermal cycling of the semiconductor substrate, said spacer.

2. The processing method of claim 1 further comprising the steps of:

removing said active region mask; and forming, after said removing step, a field isolation region in said isolation region opening.

3. The processing method of claim 2 wherein said field isolation region is an oxide.

4. The processing method of claim 3 wherein said field isolation region is planar.

5. The processing method of claim 1 wherein said barrier layer is an oxidation layer.

6. The processing method of claim 1 wherein said masking layer is a nitride layer.

7. The processing method of claim 1 wherein:

said barrier layer is an oxidation layer having a thickness in a range of about 10 Å to about 300 Å; and said masking layer has a thickness in a range of about 500 Å to about 2500 Å.

8. The processing method of claim 1 wherein said active region mask applying step includes the steps of:

applying a resist overlying said masking layer; and removing a portion of said resist to provide said exposure region.

9. The processing method of claim 1 wherein said spacer applying step comprises the steps of:

applying a resist layer, having a thickness in a range of about 100 Å to about 1000 Å, overlying said active region mask and into said opening to cover a bottom of said opening; and etching said resist layer to remove a first portion of said resist disposed overlying said etch region and to provide for a second portion of said resist layer to cover said perimeter portion of said barrier layer.

10. The processing method of claim 9 wherein said active region mask is a resist and wherein said spacer removing step comprises the step of performing a resist strip.

11. The processing method of claim 1 wherein said spacer applying step comprises the steps of:

depositing a low temperature oxide layer, having a thickness in a range of about 100 Å to about 1500 Å, overlying said masking layer and into said opening to cover a bottom of said opening; and etching said low temperature oxide layer to remove a first portion of said low temperature oxide layer disposed overlying said etch region and to provide for a second portion of said low temperature oxide layer to cover said perimeter portion of said barrier layer.

12. The processing method of claim 11 wherein said spacer is an oxide spacer and wherein said removing step comprises the step of:

removing said oxide spacer by exposing said spacer to an oxide removing chemistry.

13. The processing method of claim 12 wherein said oxide removing chemistry is a hydrofluoric acid solution.

14. The processing method of claim 12 wherein said oxide removing chemistry is a dry etch.

15. The processing method of claim 14 wherein said dry etch process is a plasma etch process.

16. The processing method of claim 1 further comprising the step of forming a planar field isolation region in said isolation region opening.

17. The processing method of claim 16 wherein said field isolation region forming step comprises the step of filling said isolation region opening with an oxide.

18. The processing method of claim 16 wherein said field isolation region forming step comprises the step of growing an oxide in said isolation region opening.

19. The processing method of claim 18 wherein said oxide in said isolation region opening is planar.

20. The processing method of claim 18 wherein said field isolation region forming step also comprises filling said isolation region opening with a second oxide.

21. The processing method of claim 19 wherein said planar oxide is grown using a high temperature dry LOCOS process.

22. The processing method of claim 1 wherein said spacer applying step comprises the steps of:

depositing a spin-on glass layer, having a thickness in a range of about 100 Angstroms to about 3000 Angstroms, overlying said masking layer and into said opening to cover a bottom of said opening; and etching said spin-on glass layer to remove a first portion of said spin-on glass layer disposed overlying said etch region and to provide for a second portion of said spin-on glass layer to cover said perimeter portion of said barrier layer.

23. The processing method of claim 2 further comprising the step of planarizing said field isolation region.

24. The processing method of 23 wherein said step of planarizing comprises application of a chemical/mechanical polish procedure.

25. A processing method to provide an isolation region in a semiconductor substrate, comprising the steps of:

providing a barrier layer directly overlying the substrate;

depositing a masking layer overlying said barrier layer;

applying an active region mask overlying said masking layer, said active region mask have an exposure region exposing a portion of said masking layer;

exposing and removing a portion of said barrier layer underlying said exposure region by removing said portion of said masking layer and into said portion of said barrier layer, to provide an opening through said active region mask and said masking layer;

applying a removable spacer inside said opening to cover a perimeter portion of said portion of said barrier layer to thereby expose a removal region of said portion of said barrier layer;

removing said barrier layer and said substrate that underlie said removal region but not under said spacer to provide for an isolation region opening in said substrate; and removing, prior to any subsequent high temperature thermal cycling of the substrate, said spacer.

26. The processing method of claim 25 wherein:

said exposing and removing step etches said portion of said masking layer;

said spacer applying step exposes an etch region; and said removing step etches said barrier layer and said substrate that underlie said removal region but not under said spacer.

27. A processing method to provide an isolation region in a semiconductor substrate, comprising the steps of:

providing a barrier layer overlying the substrate;

depositing a masking layer overlying said barrier layer;

applying an active region mask overlying said masking layer, said active region mask having an exposure region exposing a portion of said masking layer;

exposing and etching a portion of said barrier layer underlying said exposure region by etching through said portion of said masking layer and into said portion of said barrier layer, to provide an opening through said active region mask and said masking layer;

applying a removable room-temperature spacer inside said opening to cover a perimeter portion of said portion of said barrier layer to thereby expose an etch region of said portion of said barrier layer;

etching said barrier layer and said substrate that underlie said etch region but not under said spacer to provide for an isolation region opening in said substrate; and removing, prior to formation of any isolation field in said isolation region, said spacer.

* * * * *